(12) United States Patent
Jung et al.

US007979812B2

(10) Patent No.: US 7,979,812 B2
(45) Date of Patent: Jul. 12, 2011

(54) METHOD AND APPARATUS FOR CORRECTING ASSIST-FEATURE-PRINTING ERRORS IN A LAYOUT

(75) Inventors: Sunggon Jung, Hwasung (KR); Levi D. Barnes, Hillsboro, OR (US); Xiaohai Li, Hillsboro, OR (US); Robert M. Lugg, Hillsboro, OR (US); Sooryong Lee, Seoul (KR)

(73) Assignee: Synopsys, Inc., Mountain View, CA (US)

( * ) Notice: Subject to any disclaimer, the term of this patent is extended or adjusted under 35 U.S.C. 154(b) by 231 days.

(21) Appl. No.: 12/363,352

(22) Filed: Jan. 30, 2009

(65) Prior Publication Data
US 2010/0199255 A1    Aug. 5, 2010

(51) Int. Cl.
*G06F 17/50*    (2006.01)
(52) U.S. Cl. ............................................... 716/50
(58) Field of Classification Search ............... 716/1, 21, 716/50
See application file for complete search history.

(56) References Cited

U.S. PATENT DOCUMENTS

| 2004/0209169 A1* | 10/2004 | Cui et al. ........................ 430/5 |
| 2006/0236296 A1* | 10/2006 | Melvin et al. .................. 716/20 |
| 2009/0037852 A1* | 2/2009 | Kobayashi et al. ............. 716/2 |
| 2010/0099032 A1* | 4/2010 | Zou et al. ........................ 430/5 |
| 2010/0122224 A1* | 5/2010 | Lucas et al. ..................... 716/4 |
| 2010/0262946 A1* | 10/2010 | Poonawala et al. ............ 716/19 |

* cited by examiner

*Primary Examiner* — Jack Chiang
*Assistant Examiner* — Suchin Parihar
(74) *Attorney, Agent, or Firm* — Park, Vaughan, Fleming & Dowler LLP (57) ABSTRACT

One embodiment of the present invention provides a system that adjusts assist features in a layout to prevent assist features from printing. During operation, the system receives a layout. The system then identifies an assist-feature (AF)-printing hotspot in the layout, wherein the AF-printing hotspot includes a set of assist features and one or more target patterns in proximity to the set of assist features. At least one assist feature in the set of assist features is expected to print during a lithography process. Next, the system modifies the AF-printing hotspot by: (1) modifying the set of assist features; and (2) performing optical-proximity-correction (OPC) on the one or more target patterns. The system then performs a lithography simulation on the modified AF-printing hotspot to determine if: (1) a through-process-window associated with the modified AF-printing hotspot is acceptable; and (2) no assist feature in the modified set of assist features is expected to print. If so, the system replaces the AF-printing hotspot with the modified AF-printing hotspot.

26 Claims, 7 Drawing Sheets

RESOLUTION ENHANCEMENT PROCESS 300

METHOD AND APPARATUS FOR CORRECTING ASSIST-FEATURE-PRINTING ERRORS IN A LAYOUT

BACKGROUND

1. Field

Embodiments of the present invention generally relate to techniques for designing and manufacturing integrated circuits (ICs). More specifically, embodiments of the present invention relate to a technique for adjusting assist feature placements in an IC layout to correct assist-feature-printing errors.

2. Related Art

The dramatic improvements in semiconductor integration densities in recent years have largely been made possible by corresponding improvements in semiconductor manufacturing technologies.

One such manufacturing technology involves placing assist features in an IC mask layout (a "layout" hereinafter) to improve consistency of manufacturing results if one or more physical processes change during IC manufacturing. Note that the amount of drift of a process parameter which does not cause the manufacturing results to go out of the design specifications is often referred to as a "process window". For example, during an optical lithography process, the range of focus drift around an in-focus condition can be the process window. Assist features are added to the layout to improve the process window.

Assist features are not supposed to appear in the printed image on the wafer. However, sometimes assist features are actually printed on the wafer, which leads to "assist-feature (AF)-printing errors." Such AF-printing errors are undesirable and therefore need to be avoided. Typically, wider assist features have better performance on the process window. However, such wider assist features are also more likely to be printed. Consequently, placing assist features in a layout requires a balance between placing assist features in a way to improve the process window and at the same time preventing these assist features from printing in the final mask images.

Hence, what is needed is a method and apparatus for effectively eliminating AF-printing errors while achieving satisfactory through-process behavior of printed patterns without the above-described problems.

SUMMARY

One embodiment of the present invention provides a system that adjusts assist features in a layout to prevent assist features from printing. During operation, the system receives a layout. The system then identifies an assist-feature (AF)-printing hotspot in the layout, wherein the AF-printing hotspot includes a set of assist features and one or more target patterns in proximity to the set of assist features. At least one assist feature in the set of assist features is expected to print during a lithography process. Next, the system modifies the AF-printing hotspot by: (1) modifying the set of assist features; and (2) performing optical-proximity correction (OPC) on the one or more target patterns. The system then performs a lithography simulation on the modified AF-printing hotspot to determine if: (1) a through-process-window associated with the modified AF-printing hotspot is acceptable; and (2) no assist feature in the modified set of assist features is expected to print. If so, the system replaces the AF-printing hotspot with the modified AF-printing hotspot.

In some embodiments, the system modifies the set of assist features by removing one or more assist features from the set of assist features.

In some embodiments, each modified set of assist features is a subset of the set of assist features.

In some embodiments, the system removes an assist feature from the set of assist features by placing a negative assist feature of the same size and shape over the assist feature in the AF-printing hotspot.

In some embodiments, the system modifies the set of assist features by resizing one or more assist features in the set of assist features.

In some embodiments, the system identifies an AF-printing hotspot in the layout by first identifying a set of assist features in proximity to each other, wherein one or more assist features in the set of assist features are expected to print during a lithography process. The system additionally identifies one or more OPC correction segments in the layout within a predetermined distance from the set of assist features.

In some embodiments, the one or more target patterns are post-OPC target patterns.

In some embodiments, the system performs OPC locally on the one or more target patterns by shifting at least a segment of an edge of a target pattern to obtain a set of locally corrected target patterns. Typically, the goal of the OPC process is to ensure that the critical dimensions of the target patterns are within acceptable ranges.

In some embodiments, the system determines that the through process window of an AF-printing hotspot is acceptable if the through process windows for all the target patterns are acceptable.

In some embodiments, the system performs the lithography simulation on the modified AF-printing hotspot using a flash-based simulation technique.

In some embodiments, the process of modifying the AF-printing hotspot produces multiple modified AF-printing hotspots, wherein each modified AF-printing hotspot corresponds to a unique subset of the set of assist features.

In some embodiments, the system first identifies all AF-printing hotspots in the layout. The system then individually corrects each of the AF-printing hotspots to prevent assist features from printing in the layout.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Integrated Circuit Design Flow

Figure 1:
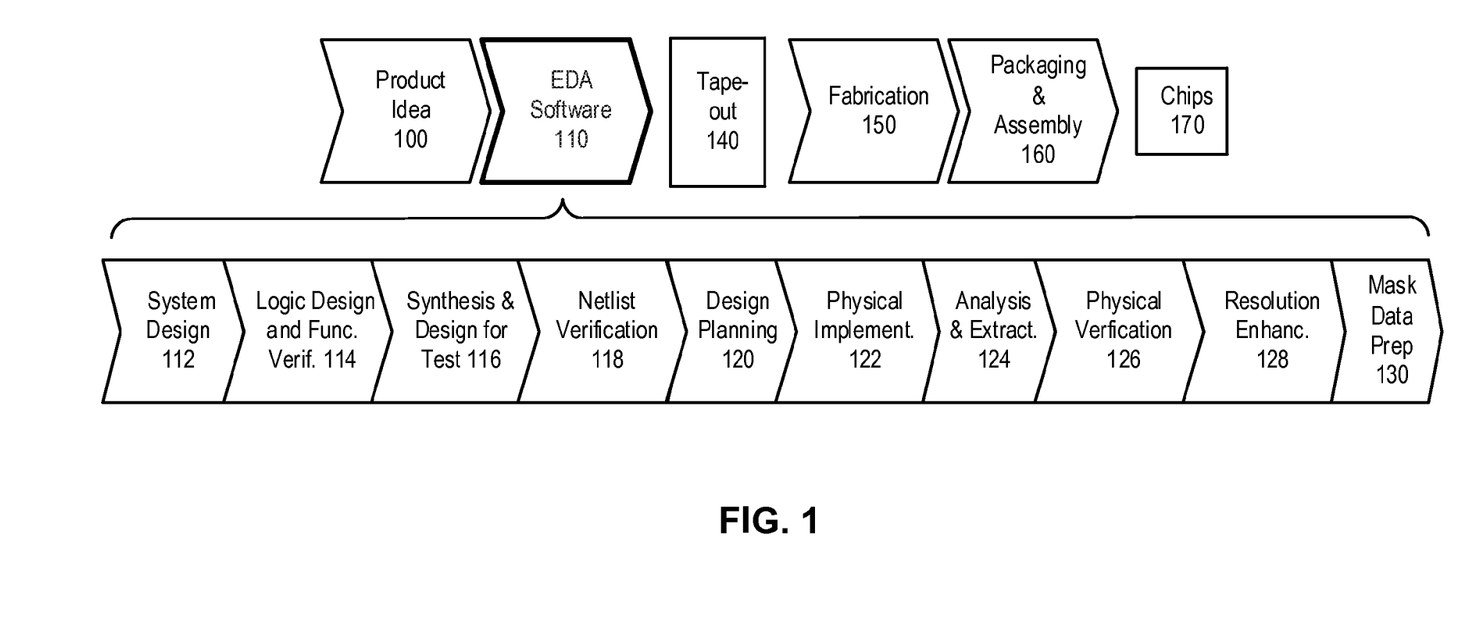
FIG. 1 illustrates various stages in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement step 128.

Assist Features

Sub-resolution assist features (hereinafter "SRAFs") are an effective way to improve through-process robustness (or depth of focus) of lithographic mask patterns by increasing the use of spatial frequency components that are largely insensitive to variations in focus condition to form desired features. The resulting increases in process margin can increase wafer yield and help to stretch existing technology to smaller process nodes. (Although embodiments of the present invention are described in the context of SRAFs, they can be used with other kinds of assist features, or alternatively with shifters in alternating phase shift masks. In the remainder of the instant application, unless otherwise noted, the term "assist feature" refers to an SRAF.) Embodiments of the present invention can be used during post-placement adjustment of an assist feature placement process.

Overview

Figure 2:
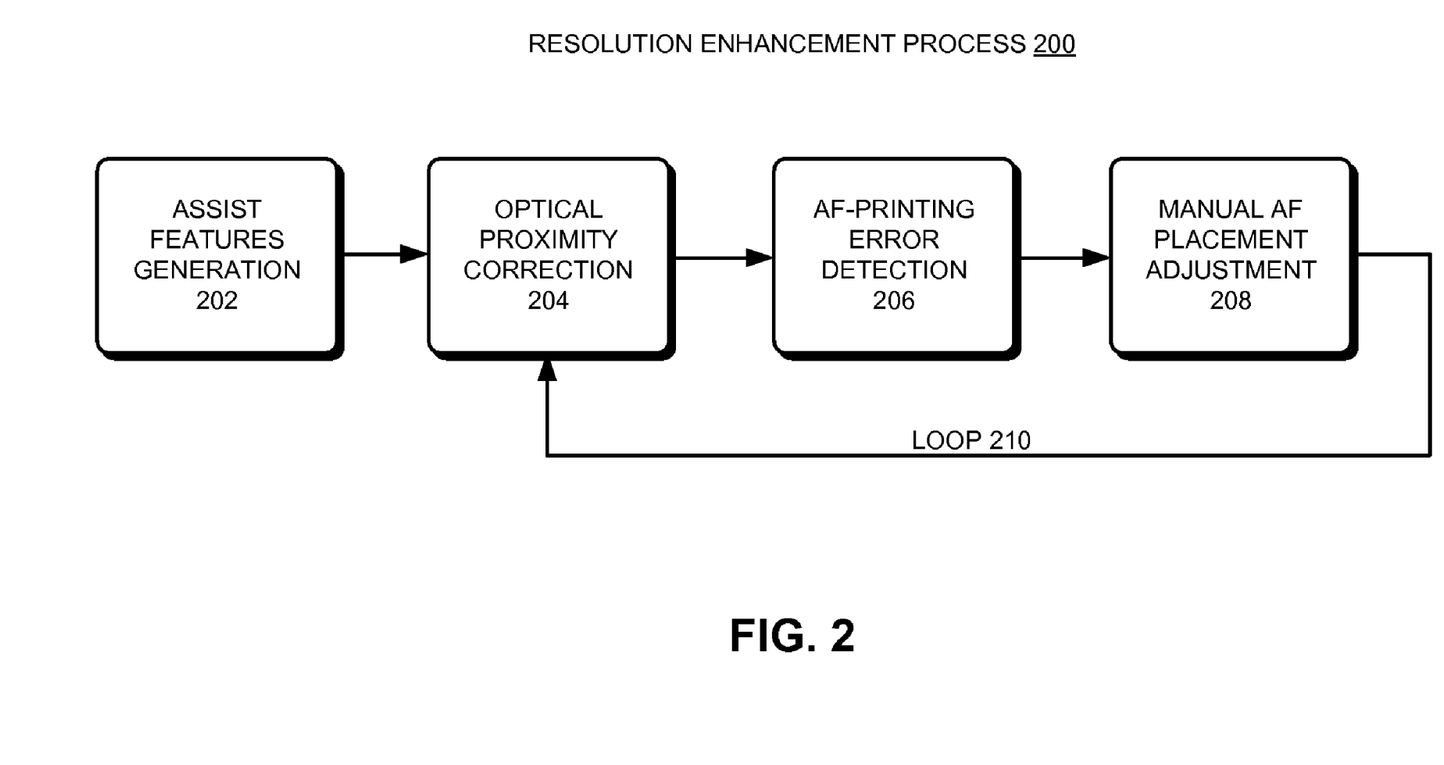
FIG. 2 illustrates a conventional resolution enhancement process for a layout which involves manually correcting AF-printing errors which are detected in the layout.

Note that the printing of assist features can be highly sensitive to the surrounding mask patterns. FIG. 2 illustrates a conventional resolution enhancement process 200 for a layout which involves manually correcting AF-printing errors which are detected in the layout. As illustrated in FIG. 2, assist features are usually placed in a mask layout (step 202) prior to performing an optical-proximity correction (OPC) on the mask layout (step 204). The assist feature placement before the OPC correction may be free of AF-printing errors. However, because the OPC step 204 can affect how the assist features interact with the mask patterns, the AF-printing problem in the layout is re-examined after the OPC correction (step 206). When AF-printing errors are detected at step 206, process 200 requires a designer to manually adjust the assist features to fix the printing problem (step 208). Because step 208 modifies the layout, the process returns to step 204, and performs a new OPC correction on the modified layout. This creates loop 210 which repeats until both the AF-printing errors are removed and the through-process behavior of the printed patterns becomes acceptable. Unfortunately, performing loop 210 can be extremely time-consuming and computationally costly because: (1) in each iteration the OPC correction step 204 is performed on the entire layout; and (2) there is no guarantee of convergence to a solution that satisfies both non-printing and process-window requirements.

Figure 3:
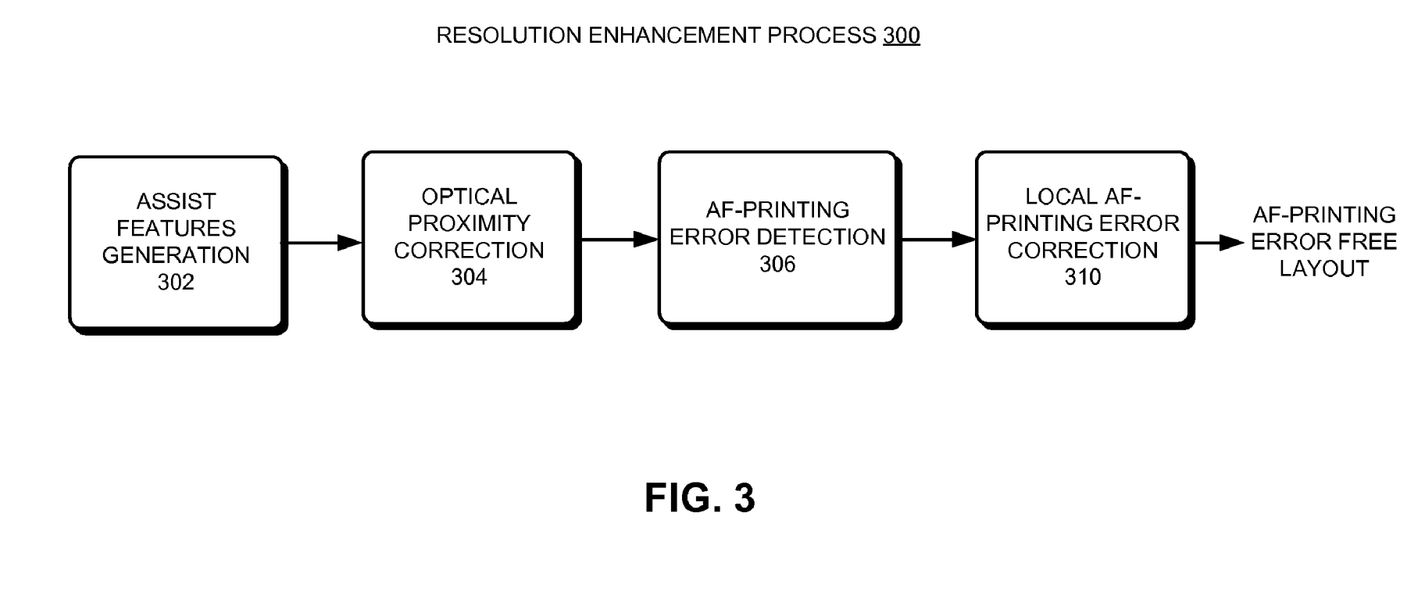
FIG. 3 illustrates a resolution enhancement process for a layout which involves locally correcting AF-printing errors which are detected in the layout in accordance with an embodiment of the present invention.

FIG. 3 illustrates a resolution enhancement process 300 for a layout which involves locally correcting AF-printing errors which are detected in the layout in accordance with an embodiment of the present invention. Similar to process 200, process 300 illustrated in FIG. 3 also includes an assist feature generation operation 302, followed by an OPC operation 304, and a subsequent AF-printing error detection operation 306. However, instead of manually adjusting the assist feature placement as in operation 208, process 300 replaces operation 208 in FIG. 2 with a local AF-printing error correction operation 310. Moreover, the process 300 eliminates the loop operation 210 required by process 200. As a result, the present technique only requires one full-layout OPC operation and one full-layout AF-printing error detection operation.

More specifically, after identifying all AF-printing errors in the layout, the present technique then identifies localized regions containing these errors. Hence, the printing errors are isolated within multiple localized regions, wherein each localized region may contain one or more AF-printing errors, and as such, one or more assist features. Next, for each localized region, the present technique exhaustively searches for the best set of assist features to eliminate from the existing assist features within the region, so that the remaining assist features in the region can both solve the printing problem and provide acceptable through-process edge placement error (EPE) for all segments within a given distance of the region. Note that the effectiveness of this technique is achieved by the ability to quickly correct these nearby segments and by limiting the correction operation to a small local area around an AF-printing error.

Process for Correcting AF-Printing Errors

Figure 4:
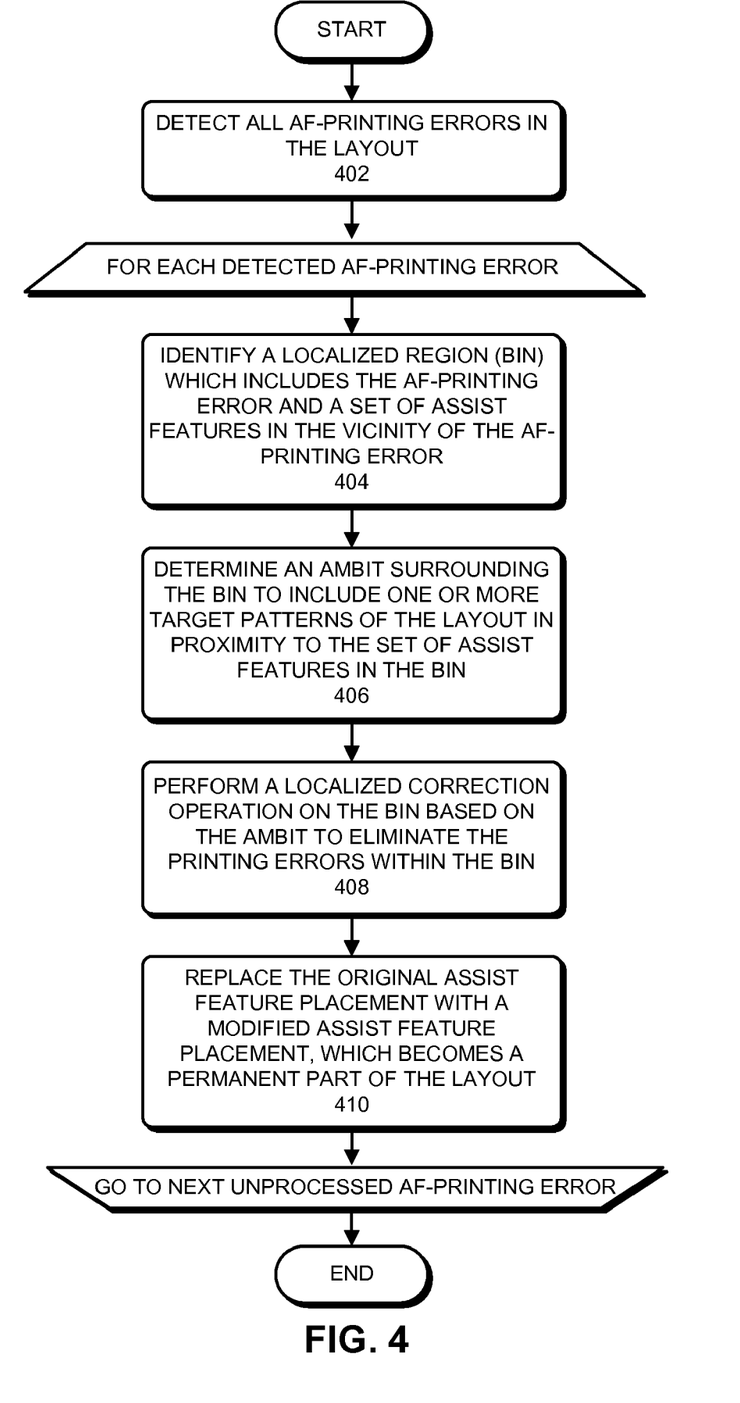
FIG. 4 presents a flowchart illustrating a process for eliminating AF-printing errors which are detected in a layout in accordance with an embodiment of the present invention.

FIG. 4 presents a flowchart illustrating a process for eliminating AF-printing errors which are detected in a layout in accordance with an embodiment of the present invention.

During operation, the system starts by detecting all AF-printing errors in the layout (step 402). In one embodiment, an AF-printing error is detected if any section of a given assist feature is expected to print in the final wafer image. Note that step 402 can be a conventional detection operation similar to operation 206 in FIG. 2.

For each detected AF-printing error in the layout, the system then identifies a localized region which includes the AF-printing error and a set of assist features in the vicinity of the AF-printing error (step 404). Note that each identified bin is treated as a single AF-printing hotspot. In some embodiments, an identified bin can include more than one AF-printing error. However, because these printing errors are sufficiently close to each other, they are treated as a single AF-printing hotspot in the layout and are corrected together.

For a printing error associated with an assist feature which is placed in the gap region between two target patterns, the system determines a localized region for the printing error in the following manner.

The system first determines a distance between two adjacent target patterns which are located on both sides of the AF-printing error. This distance is then used to define the size of a "bin" which encloses the AF-printing error and includes sections of assist features in the vicinity of the printing error.

Figure 5:
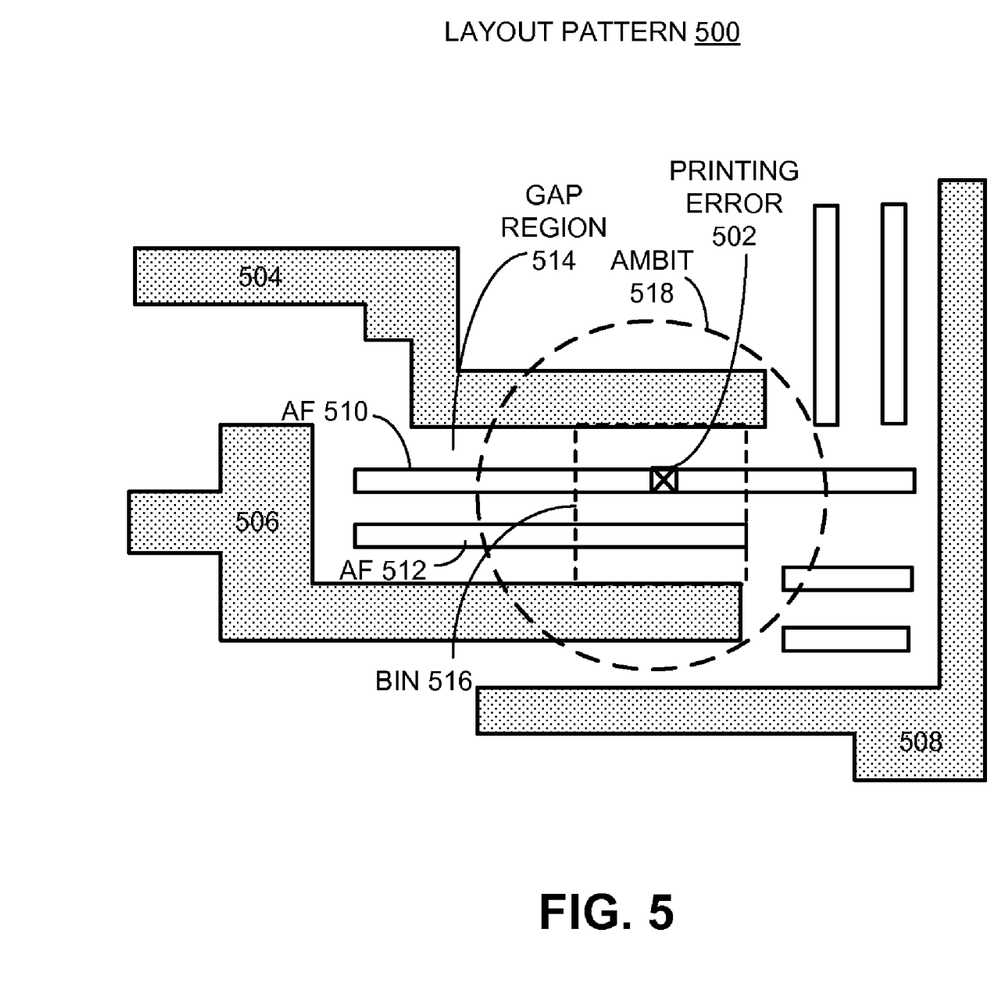
FIG. 5 illustrates a process for determining a "bin" for an AF-printing error in an exemplary layout pattern in accordance with an embodiment of the present invention.

FIG. 5 illustrates a process for determining a "bin" for an AF-printing error 502 in an exemplary layout pattern 500 in accordance with an embodiment of the present invention. As illustrated in FIG. 5, layout pattern 500 includes three target patterns 504, 506, and 508 (shaded polygons). In one embodiment, these target patterns are post-OPC target patterns.

Layout pattern 500 also includes multiple assist features (thin rectangles) placed in the gap regions between these target patterns. For example, assist features 510 and 512 are disposed in a gap region 514 between target patterns 504 and 506, wherein assist feature 510 contains AF-printing error 502. Note that a bin 516 is shown in FIG. 5 which encloses AF-printing error 502. The size of bin 516 is determined by the distance between target patterns 504 and 506 near printing error 502. Note that bin 516 defines a localized region which includes all the assist features placed in gap region 514. Although the width of bin 516 in the horizontal direction is shown substantially equal to the height of bin 516, generally the two dimensions of a bin can be different.

Note that assist features 510 and 512 are much longer than the width of bin 516, and only portions of these assist features are enclosed by bin 516. Generally, the dimension of the bin in the direction parallel to the long axis of the assist feature determines the only portions of the assist feature to be adjusted in the subsequent assist feature correction process.

Returning to FIG. 4, after identifying the bin to include the AF-printing error and the assist features, the system next determines an ambit surrounding the bin to include one or more target patterns of the layout in proximity to the set of assist features in the bin (step 406). In one embodiment, the ambit defines a range of interaction between the set of assist features in the bin and the nearby target patterns. More specifically, each point on an edge of a target pattern within the ambit can have a non-negligible contribution to a location on an assist feature within the bin. Note that the size of the ambit can be predetermined or user-defined.

For example, in FIG. 5, an ambit 518 is shown enclosing bin 516, wherein ambit 518 defines a region which includes portions of target patterns 504 and 506. These target patterns within ambit 518 are sufficiently close to the set of assist features 510 and 512 in bin 516 so that they interact during the lithography process. Note that the area of the ambit remains as a localized region which typically has a size comparable to the wavelength of the illumination source. By identifying an ambit for a bin, the system identifies the target patterns which interact with the bin to cause the AF-printing errors. Note that although ambit 518 is shown as having a circular shape, generally, the shape of an ambit is not limited to being circular.

Returning to FIG. 4, for each identified bin and the associated ambit in the layout, the system performs a localized correction operation on the bin based on the associated ambit in an attempt to eliminate the AF-printing errors within the bin (step 408). In one embodiment, the correction operation modifies the assist feature configuration within a bin. Moreover, the target patterns within the associated ambit can also be modified during the process. A detailed process of step 408 for locally correcting printing errors within a bin is described below in conjunction with FIG. 6. If step 408 is successful, the system determines a modified assist feature configuration which resolves the AF-printing errors in the bin. The system subsequently replaces the original assist feature placement with the modified assist feature placement (step 410).

In one embodiment, the system can sequentially process each of the identified bins to eliminate the printing errors one at a time. In another embodiment, the system can process multiple bins in parallel. Note that this parallel correction is possible because the correction operations on different bins are independent from each other.

Note that above-described process performs independent and localized layout corrections. Regions of the layout which are not specified as hotspots remain unaffected. Because these unaffected regions occupy the majority of the layout, the present technique requires significantly less computational resources in comparison to the process described in conjunction with FIG. 2. Note that the saving in computation is also due to eliminating the loop operation on the full layout.

Process for Locally Correcting an AF-Printing Hotspot

Figure 6:
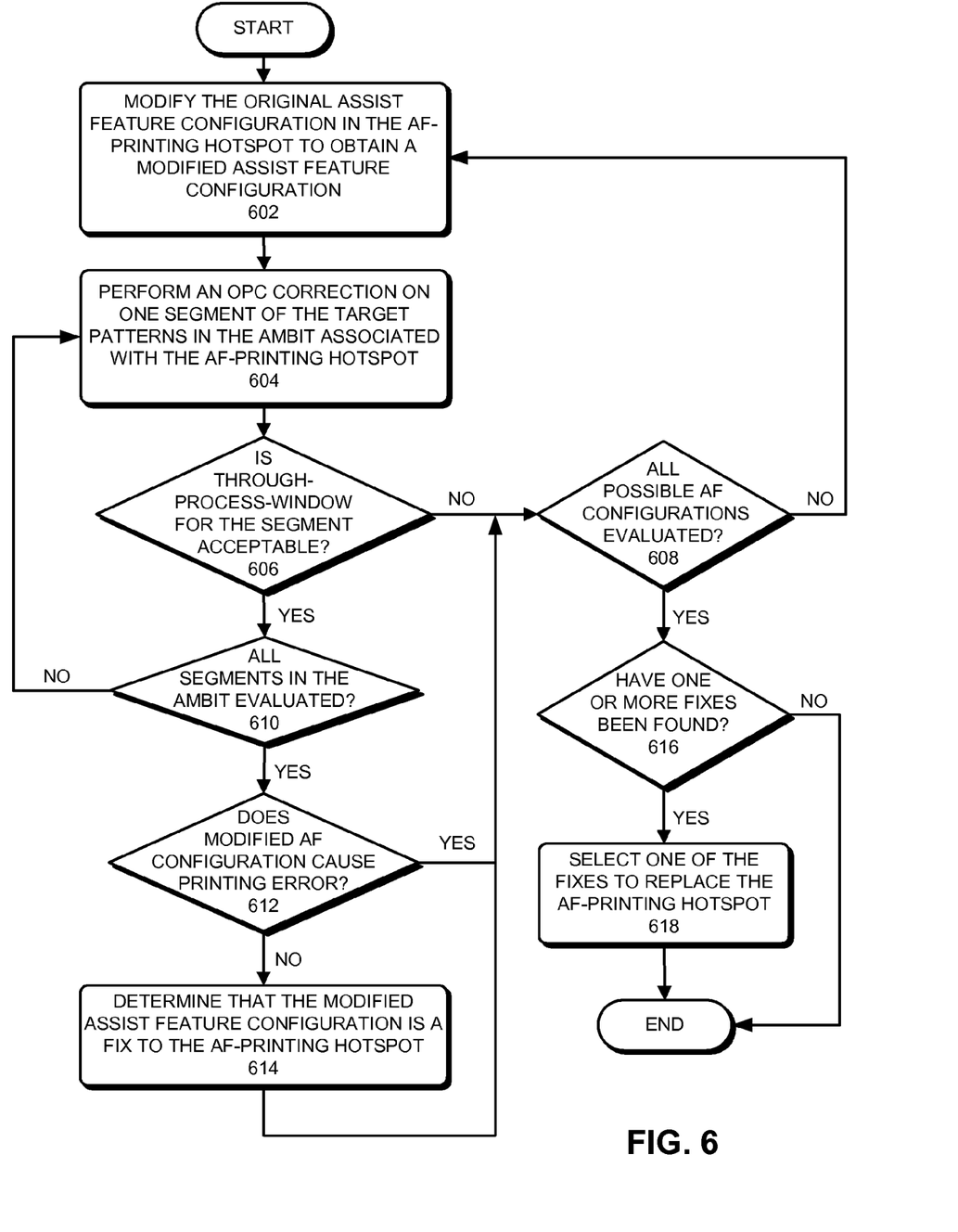
FIG. 6 presents a flowchart illustrating a process for correcting an AF-printing hotspot to eliminate AF-printing errors in the hotspot in accordance with an embodiment of the present invention.

FIG. 6 presents a flowchart illustrating a process for correcting an AF-printing hotspot to eliminate AF-printing errors in the hotspot in accordance with an embodiment of the present invention.

During operation, the system starts by modifying the original assist feature configuration in the AF-printing hotspot to obtain a modified assist feature configuration (step 602). In one embodiment of the present invention, a modified assist feature configuration is obtained by removing a subset of the assist features from the original assist feature configuration.

For example, if an AF-printing hotspot comprises three assist features AF1, AF2, and AF3, then the possible modified assist feature configurations are: (1) [AF1, AF2] by removing AF3, (2) [AF2, AF3] by removing AF1, (3) [AF1, AF3] by removing AF2, (4) [AF1] by removing AF2 and AF3, (5) [AF2] by removing AF1 and AF3, and (6) [AF3] by removing AF1 and AF2. Note that each of these assist feature configurations corresponds to a modified AF-printing hotspot. For the exemplary layout of FIG. 5, the modified assist feature configurations in bin 516 are simply assist feature 510 or assist feature 512.

In one embodiment of the present invention, to simulate removing an assist feature from the AF-printing hotspot, the system places a negative assist feature of the same size and shape over the assist feature to be removed.

In some embodiments, a modified assist feature configuration can be obtained by resizing one or more assist features in the original assist feature configuration. Note that this resizing operation can include both shrinking and growing the size of a given assist feature in the original assist feature configuration. Furthermore, the resizing operation can also simultaneously shrink one or more assist features while grow one or more other assist features.

In some embodiments, a modified assist feature configuration can also be obtained by removing a subset of the assist features from the original assist feature configuration and resizing one or more assist features in the remaining assist features. Note that other types of modification techniques may be used to obtain the modified assist feature configuration.

Next, for each modified assist feature configuration, the system performs an OPC correction on one segment of the target patterns in the ambit associated with the AF-printing hotspot (step 604). Note that when the target patterns in the ambit are post-OPC target patterns, the system can use preexisting segmentation of these target patterns. Typically, the preexisting segmentation partitions each edge of a target pattern into a set of segments. During the subsequent OPC process, each segment is shifted separately from the original position to pre-compensate for the lithography effect. Hence, prior to step 604, the system may need to identify all predefined segments within the ambit, and can process these segments in a predetermined order. However, if such preexisting segments are not available, the system can first partition the edges of the target patterns within the ambit into a set of segments using a conventional segmentation technique.

In one embodiment of the present invention, the OPC correction on one segment of a target pattern is a "one-iteration" OPC correction such that each segment is independently corrected without having to update its position when corrections are made to its neighboring segments. Such one-iteration correction, however, can involve multiple trials to search for an ideal position of the segment.

After the OPC correction on the segment, the system performs a lithography simulation on the modified assist feature configuration and the OPC corrected target patterns, and subsequently determines if a through-process-window associated with the OPC corrected segment is acceptable (step 606). In one embodiment, determining if the through-process-window is acceptable involves checking a through-process edge placement error (EPE) of the OPC corrected segment.

Note that when performing the above lithography simulation, the system does not have to separately re-compute for each modified assist feature configuration. Instead, the system can store the computation result for the original assist feature configuration, and then use a flash-based simulation technique to quickly evaluate the simulation result for each modified assist feature configuration based on the stored computation result. For example, this flash-based technique for quickly evaluating a modified layout is described in "Proximity Correction Software for Wafer Lithography," U.S. Pat. No. 6,289,499 and in "Proximity Correction System for Wafer Lithography," U.S. Pat. No. 6,081,685, both by inventors Michael L. Rieger and John P. Stirniman.

Returning to FIG. 6, if the through-process-window for the OPC corrected segment is not acceptable, (for example, when the EPE value is out of the predetermined range), the system determines that the modified assist feature configuration cannot be used to correct the AF-printing hotspot, and the modified assist feature configuration is immediately rejected.

The system then determines if all possible modified assist feature configurations have been evaluated (step 608). If not, the system returns to step 602 to evaluate the next modified assist feature configuration.

If the through-process-window for the OPC corrected segment is acceptable, the system next determines if all the segments in the associated ambit have been evaluated (step 610). If not, the system returns to step 604 to evaluate the next segment of the target patterns in the ambit.

If all segments in the ambit have been evaluated successfully, the system subsequently detects if the modified assist feature configuration causes AF-printing errors (step 612). If so, the modified assist feature configuration cannot resolve the AF-printing hotspot. The system immediately rejects the modified assist feature configuration, and then returns to step 608.

Otherwise, the system determines that the modified assist feature configuration is a fix to the AF-printing hotspot (step 614). This is because this modified assist feature configuration satisfies both the through-process-window requirement and the non-printing requirement. The system next returns to step 608.

At step 608, when the system determines that all possible modified assist feature configurations have been evaluated, the system subsequently determines if one or more fixes have been found (step 616). If so, the system can select one of the fixes to replace the AF-printing hotspot (step 618). In one embodiment of the present invention, the system can compute a score for each determined fix to the hotspot, wherein the score is computed based on the through-process-window performance for the set of segments. The system can select a fix which has the highest score to replace the AF-printing hotspot.

Note that the process for correcting an AF-printing hotspot is not limited to the particular embodiment of FIG. 6. In one variation to FIG. 6, the system can perform a segment-based evaluation, so that each segment is tested against the set of possible assist feature configurations. In this embodiment, the set of segments becomes the outer loop, wherein the set of assist feature configurations becomes the inner loop. In another variation to FIG. 6, the system verifies each assist feature configuration for AF-printing errors prior to evaluating the though-process-window performance.

Note that because the area of each ambit is small, the number of segments within each ambit is also small. The small number of segments, in combination with a small number of possible assist feature configurations, ensures that the process for correcting one AF-printing hotspot does not require a large amount of computation. Further savings in the amount of computation can be achieved by using a flash-based simulation technique. Note that we can treat the modifications to the set of assist features as perturbations to the original assist feature configuration.

Figure 7:
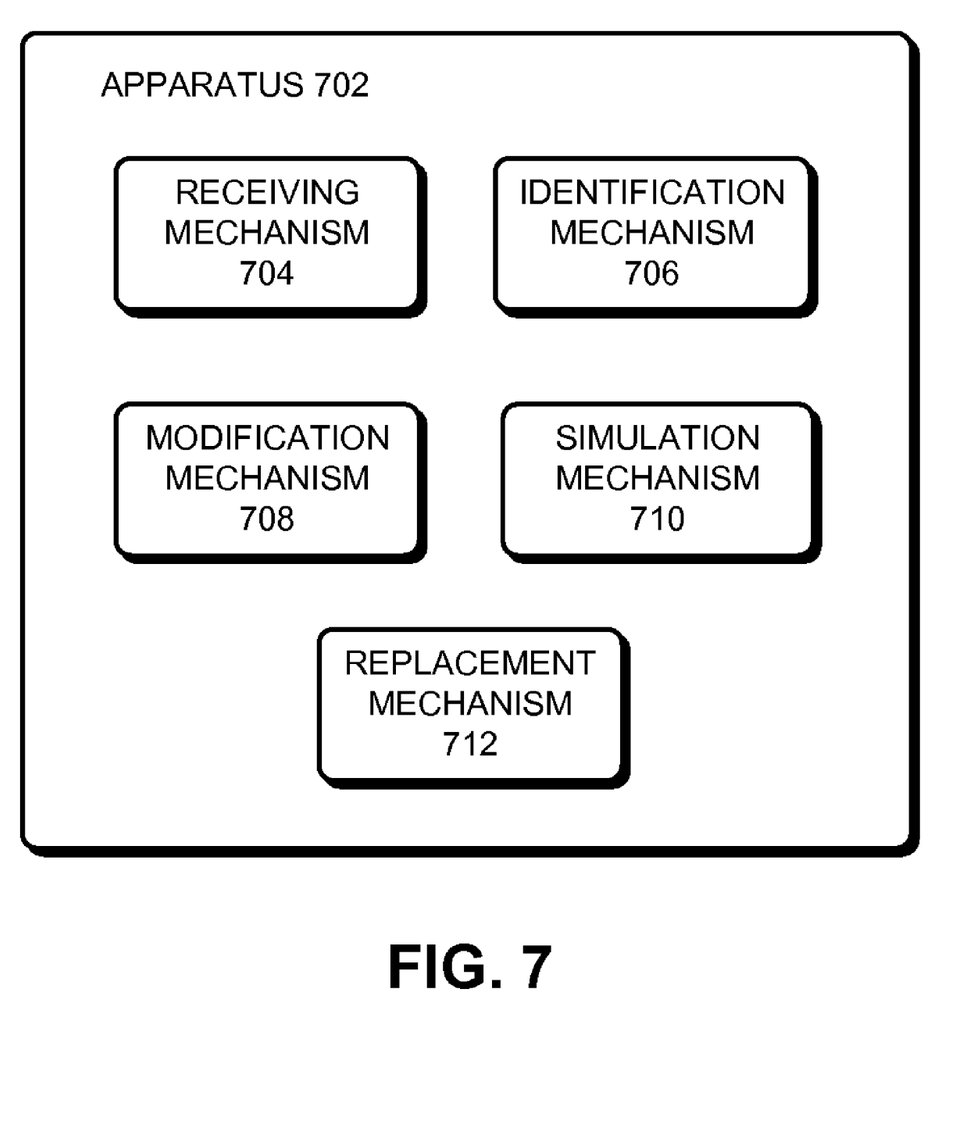
FIG. 7 illustrates an apparatus that automatically adjusts assist features in a layout to prevent assist features from printing in accordance with an embodiment of the present invention.

FIG. 7 illustrates an apparatus that automatically adjusts assist features in a layout to prevent assist features from printing in accordance with an embodiment of the present invention.

Apparatus 702 can comprise mechanisms which communicate with one another via a wire or wireless communication channel. Specifically, apparatus 702 can comprise a receiving mechanism 704, an identification mechanism 706, a modification mechanism 708, a simulation mechanism 710, and a replacement mechanism 712. A mechanism may be realized using one or more integrated circuits or as a module of a general purpose processor. Apparatus 702 can be part of a computer system.

In some embodiments, receiving mechanism 704 may be configured to receive a layout; identification mechanism 706 may be configured to identify an AF-printing hotspot in the layout; modification mechanism 708 may be configured to modify the AF-printing hotspot; simulation mechanism 710 may be configured to perform a lithography simulation on the modified AF-printing hotspot; and replacement mechanism 712 may be configured to replace the AF-printing hotspot with the modified AF-printing hotspot.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for automatically adjusting assist features in a layout to prevent assist features from printing, the method comprising:
receiving a layout;
identifying an assist-feature (AF)-printing hotspot which defines a localized region within the layout, wherein the AF-printing hotspot comprises a set of assist features and one or more target patterns in proximity to the set of assist features, wherein at least one assist feature in the set of assist features is expected to print during a lithography process;
modifying the AF-printing hotspot by:
modifying the set of assist features within the AF-printing hotspot; and
performing a local optical-proximity-correction (OPC) on the one or more target patterns within the AF-printing hotspot;
performing, by computer, a lithography simulation on the modified AF-printing hotspot to determine if:
a through-process-window associated with the modified AF-printing hotspot is acceptable; and
no assist feature in the modified set of assist features is expected to print; and
if so, replacing the AF-printing hotspot with the modified AF-printing hotspot.

2. The method of claim 1, wherein modifying the set of assist features involves removing one or more assist features from the set of assist features.

3. The method of claim 2, wherein each modified set of assist features is a subset of the set of assist features.

4. The method of claim 2, wherein removing an assist feature from the set of assist features involves placing a negative assist feature of the same size and shape over the assist feature in the AF-printing hotspot.

5. The method of claim 1, wherein modifying the set of assist features involves resizing one or more assist features in the set of assist features.

6. The method of claim 1, wherein identifying an AF-printing hotspot in the layout involves:
identifying a set of assist features in proximity to each other, wherein one or more of the set of assist features are expected to print during a lithography process; and
identifying one or more OPC correction segments in the layout within a predetermined distance from the set of assist features.

7. The method of claim 1, wherein the one or more target patterns are post-OPC target patterns.

8. The method of claim 1, wherein performing the OPC on the one or more target patterns involves shifting a segment of an edge of a target pattern to obtain a set of locally corrected target patterns.

9. The method of claim 8, wherein determining if a through-process-window associated with the modified AF-printing hotspot is acceptable involves:
for each of the locally corrected target patterns, determining if the through-process-window is acceptable; and
if so, determining that the through-process-window associated with the modified AF-printing hotspot is acceptable;
otherwise, determining that the through-process-window associated with the modified AF-printing hotspot is not acceptable.

10. The method of claim 1, wherein performing the lithography simulation on the modified AF-printing hotspot involves using a flash-based simulation technique.

11. The method of claim 1, wherein the process of modifying the AF-printing hotspot produces multiple modified AF-printing hotspots, wherein each modified AF-printing hotspot corresponds to a unique subset of the set of assist features.

12. The method of claim 1, wherein the method further comprises:
   identifying all AF-printing hotspots in the layout; and
   individually correcting each of the AF-printing hotspots to prevent assist features from printing in the layout.

13. A non-transitory computer-readable storage medium storing instructions that when executed by a computer cause the computer to perform a method for automatically adjusting assist features in a layout to prevent assist features from printing, the method comprising:
   receiving a layout;
   identifying an assist-feature (AF)-printing hotspot which defines a localized region within the layout, wherein the AF-printing hotspot comprises a set of assist features and one or more target patterns in proximity to the set of assist features, wherein at least one assist feature in the set of assist features is expected to print during a lithography process;
   modifying the AF-printing hotspot by:
      modifying the set of assist features within the AF-printing hotspot; and
      performing a local optical-proximity-correction (OPC) on the one or more target patterns within the AF-printing hotspot;
   performing a lithography simulation on the modified AF-printing hotspot to determine if:
      a through-process-window associated with the modified AF-printing hotspot is acceptable; and
      no assist feature in the modified set of assist features is expected to print; and
   if so, replacing the AF-printing hotspot with the modified AF-printing hotspot.

14. The non-transitory computer-readable storage medium of claim 13, wherein modifying the set of assist features involves removing one or more assist features from the set of assist features.

15. The non-transitory computer-readable storage medium of claim 14, wherein each modified set of assist features is a subset of the set of assist features.

16. The non-transitory computer-readable storage medium of claim 14, wherein removing an assist feature from the set of assist features involves placing a negative assist feature of the same size and shape over the assist feature in the AF-printing hotspot.

17. The non-transitory computer-readable storage medium of claim 13, wherein modifying the set of assist features involves resizing one or more assist features in the set of assist features.

18. The non-transitory computer-readable storage medium of claim 13, wherein identifying an AF-printing hotspot in the layout involves:
   identifying a set of assist features in proximity to each other, wherein one or more of the set of assist features are expected to print during a lithography process; and
   identifying one or more OPC correction segments in the layout within a predetermined distance from the set of assist features.

19. The non-transitory computer-readable storage medium of claim 13, wherein the one or more target patterns are post-OPC target patterns.

20. The non-transitory computer-readable storage medium of claim 13, wherein performing the OPC on the one or more target patterns involves shifting a segment of an edge of a target pattern to obtain a set of locally corrected target patterns.

21. The non-transitory computer-readable storage medium of claim 20, wherein determining if a through-process-window associated with the modified AF-printing hotspot is acceptable involves:
   for each of the locally corrected target patterns, determining if the through-process-window is acceptable; and
   if so, determining that the through-process-window associated with the modified AF-printing hotspot is acceptable;
   otherwise, determining that the through-process-window associated with the modified AF-printing hotspot is not acceptable.

22. The non-transitory computer-readable storage medium of claim 13, wherein performing the lithography simulation on the modified AF-printing hotspot involves using a flash-based simulation technique.

23. The non-transitory computer-readable storage medium of claim 13, wherein the process of modifying the AF-printing hotspot produces multiple modified AF-printing hotspots, wherein each modified AF-printing hotspot corresponds to a unique subset of the set of assist features.

24. The non-transitory computer-readable storage medium of claim 13, wherein the method further comprises:
   identifying all AF-printing hotspots in the layout; and
   individually correcting each of the AF-printing hotspots to prevent assist features from printing in the layout.

25. An apparatus that automatically adjusts assist features in a layout to prevent assist features from printing, comprising:
   a receiving mechanism configured to receive a layout;
   an identification mechanism configured to identify an assist-feature (AF)-printing hotspot which defines a localized region within the layout, wherein the AF-printing hotspot comprises a set of assist features and one or more target patterns in proximity to the set of assist features, wherein at least one assist feature in the set of assist features is expected to print during a lithography process;
   a modification mechanism configured to modify the AF-printing hotspot by:
      modifying the set of assist features within the AF-printing hotspot; and
      performing a local optical-proximity-correction (OPC) on the one or more target patterns within the AF-printing hotspot;
   a simulation mechanism configured to perform a lithography simulation on the modified AF-printing hotspot to determine if:
      a through-process-window associated with the modified AF-printing hotspot is acceptable; and
      no assist feature in the modified set of assist features is expected to print; and
   a replacement mechanism configured to replace the AF-printing hotspot with the modified AF-printing hotspot.

26. The apparatus of claim 25, wherein the modification mechanism is configured to modify the set of assist features by:
   removing one or more assist features from the set of assist features; and
resizing one or more assist features in the remaining set of assist features.

* * * * *